United States Patent
Oishi

(10) Patent No.: US 8,532,366 B2
(45) Date of Patent: Sep. 10, 2013

(54) POSITION DETECTING METHOD

(75) Inventor: Satoru Oishi, Utsunomiya (JP)

(73) Assignee: Canon Kabushiki Kaisha (JP)

(*) Notice: Subject to any disclaimer, the term of this patent is extended or adjusted under 35 U.S.C. 154(b) by 84 days.

(21) Appl. No.: 13/156,993

(22) Filed: Jun. 9, 2011

(65) Prior Publication Data

US 2011/0242509 A1     Oct. 6, 2011

Related U.S. Application Data

(63) Continuation of application No. 11/244,558, filed on Oct. 5, 2005, now Pat. No. 7,983,472.

(30) Foreign Application Priority Data

Oct. 5, 2004   (JP) .................................. 2004-293026

(51) Int. Cl.
*G06K 9/00*   (2006.01)

(52) U.S. Cl.
USPC ........... 382/151; 382/103; 382/141; 382/145; 356/401

(58) Field of Classification Search
USPC .......... 382/103, 141, 144, 145, 151; 356/401
See application file for complete search history.

(56) References Cited

U.S. PATENT DOCUMENTS

| | | | |
|---|---|---|---|
| 3,752,589 A * | 8/1973 | Kobayashi | .................... 356/401 |
| 4,777,641 A | 10/1988 | Inagaki et al. | |
| 4,860,374 A * | 8/1989 | Murakami et al. | ............ 382/151 |
| 5,493,403 A | 2/1996 | Nishi | |
| 5,543,921 A | 8/1996 | Uzawa et al. | |
| 5,827,629 A | 10/1998 | Miyatake | |
| 5,943,638 A | 8/1999 | Aoyagi | |
| 2004/0059540 A1 | 3/2004 | Matsumoto et al. | |
| 2004/0257573 A1 | 12/2004 | Matsumoto | |
| 2005/0259257 A1 | 11/2005 | Matsumoto et al. | |

FOREIGN PATENT DOCUMENTS

| | | |
|---|---|---|
| JP | 1-207604 A | 8/1989 |
| JP | 06-151274 | 5/1994 |
| JP | 08-094315 | 4/1996 |
| JP | 09-027449 A | 1/1997 |
| JP | 09-139333 A | 5/1997 |
| JP | 2004-117030 | 4/2004 |
| JP | 2006-108386 A | 4/2006 |

* cited by examiner

*Primary Examiner* — Wesley Tucker
(74) *Attorney, Agent, or Firm* — Rossi, Kimms & McDowell LLP

(57) ABSTRACT

A method detects a position of a mark based on an image signal of the mark. The method includes steps of obtaining a first position of the mark by performing a first process for the image signal, extracting plural feature values from the image signal based on the first position, and detecting the position of the mark by obtaining an offset value for the first position based on the plural feature values.

13 Claims, 13 Drawing Sheets

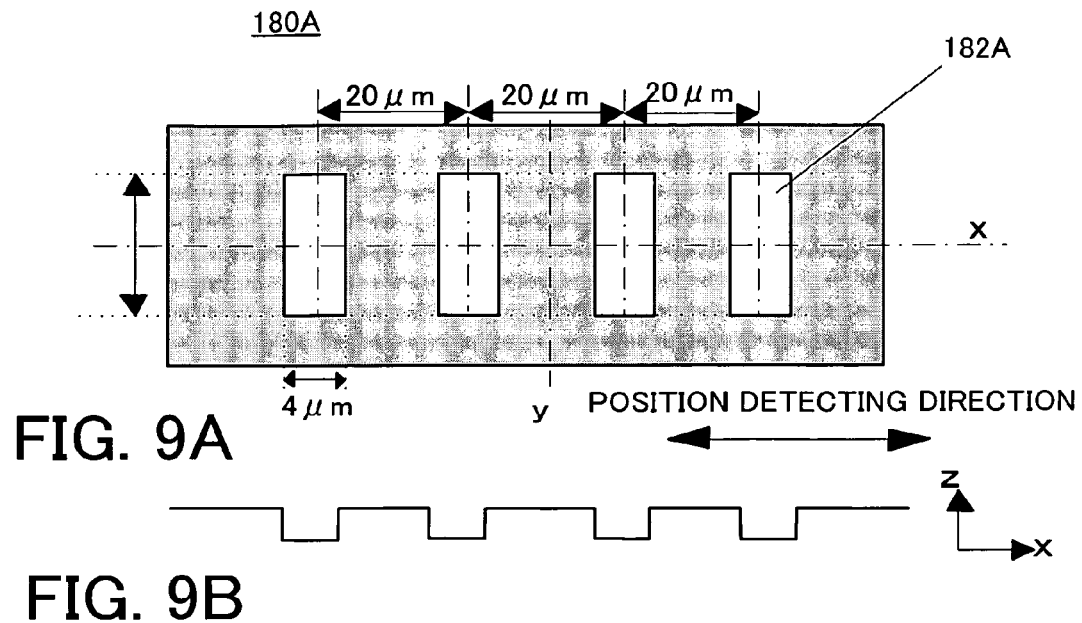
FIG. 9A
FIG. 9B
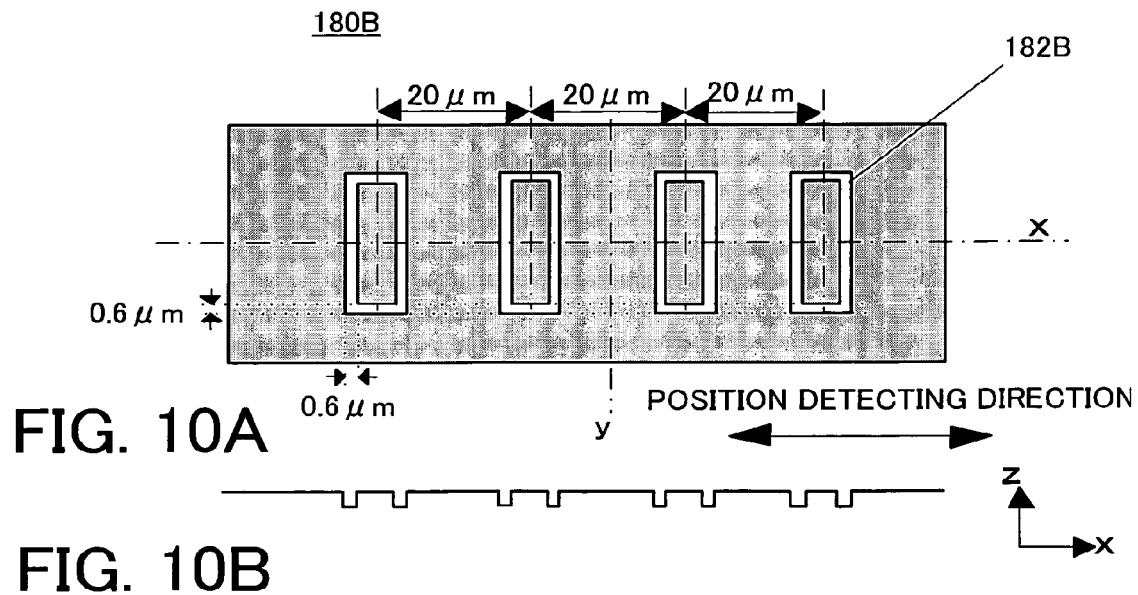
FIG. 10A
FIG. 10B

POSITION DETECTING METHOD

CROSS REFERENCE TO RELATED APPLICATION

This application is a continuation of U.S. patent application Ser. No. 11/244,558, filed Oct. 5, 2005, which claims priority from Japanese Patent Application No. 2004-293026, filed Oct. 5, 2004. The contents of the documents cited in this section are hereby incorporated herein by reference.

BACKGROUND OF THE INVENTION

The present invention relates to a position detecting method, and more particularly, though not exclusively, to a method for detecting a position of an alignment mark provided on a wafer. The present invention is suitable, for example, for manufactures of various devices including semiconductor chips such as ICs and LSIs, display devices such as liquid crystal panels, sensing devices such as magnetic heads, and image-pickup devices such as CCDs.

Recent high-performance and inexpensive electronic apparatuses need more economic and precisely manufactured semiconductors installed in them, and require an exposure apparatus that exposes a semiconductor circuit pattern to have precision and efficiency in the transfer of a circuit pattern of a reticle or a mask (collectively referred to as a "reticle" hereinafter) onto a wafer and a glass plate (collective referred to as a "wafer" hereinafter), onto which a photosensitive material (referred to as "resist" hereinafter) is applied. In general, precise exposure of a circuit pattern requires a precise alignment between the reticle and the wafer.

A conventional alignment method exposes alignment marks on a wafer at the same time when the circuit pattern of the reticle is exposed, and sequentially measures positions of plural preset alignment marks among the alignment marks formed on the wafer after the exposure process, using an alignment detection optical system. After the position measurement result is statistically processed to calculate the entire shot arrangement, and the wafer is positioned in relation to the reticle based on the calculation result.

The alignment marks are indexes to align the reticle and the wafer with high precision. Recent fine processing to circuit patterns requires a precise alignment mark. The special semiconductor manufacturing technology, such as a chemical mechanical polishing ("CMP") process, has been recently introduced. Along with this, a wafer induced shift ("WIS") as a positional detection error caused by a wafer process occurs, scatters shapes of the alignment marks among wafers and among shots, and deteriorates the alignment accuracy. One solution for this problem is an offset correction to correct the WIS, as disclosed in Japanese Patent Application, Publication No. 2004-117030. The offset correction previously calculates a true position of an alignment mark and a shift amount from the alignment mark detected by a detection system, and uses the offset value to correct the position of the alignment mark detected by the detection system. The position of the alignment mark actually detected by the detection system is also referred to as an "actual position" hereinafter. Conventionally, as in Japanese Patent Application No. 2004-117030, a linear function is used to calculate the shift amount.

Other prior art relating to the position detecting method include, for example, Japanese Patent Applications Nos. 6-151274 and 8-94315.

However, the WIS occurs due to a single cause, an interaction among plural causes, and an apparatus cause, such as an exposure apparatus and an alignment optical system. Therefore, the linear function has a difficulty to predict a shift amount, or to detect a position of an alignment mark precisely. The apparatus cause is also referred to as a tool induced shift ("TIS"). An interaction between the process error and the apparatus error is referred to as a TIS-WIS interaction.

BRIEF SUMMARY OF THE INVENTION

With the foregoing in mind, it is an exemplified object of the present invention to detect a position precisely.

A method according to one aspect of the present invention of detecting a position of a mark based on an image signal of the mark includes steps of obtaining a first position of the mark by performing a first process for the image signal, extracting plural feature values from the image signal based on the first position, and detecting the position of the mark by obtaining an offset value for the first position based on the plural feature values.

An exposure apparatus according to another aspect of the present invention to detect a position of a mark formed on an object to be exposed to light based on an image signal of the mark, and to expose the object to the light based on the detected position includes a detector configured to output the image signal, and a processor configured to obtain a first position of the mark by performing a first process for the image signal, to extract plural feature values from the image signal based on the first position, and to detect the position of the mark by obtaining an offset value for the first position based on the plural feature values.

A method according to still another aspect of the present invention of detecting a position of a mark based on an image signal of the mark includes steps of obtaining a first position of the mark by performing a first process for the image signal, extracting plural feature values from the image signal, and detecting the position of the mark by obtaining an offset value for the first position based on a function, of which an order is higher than two, having the plural feature values as variables.

An exposure apparatus according to another aspect of the present invention to detect a position of a mark formed on an object to be exposed to light based on an image signal of the mark, and to expose the object to the light based on the detected position includes a detector configured to output the image signal, and a processor configured to obtain a first position of the mark by performing a first process for the image signal, to extract plural feature values from the image signal, and to detect the position of the mark by obtaining an offset value for the first position based on a function, of which an order is higher than two, having the plural feature values as variables.

A method of manufacturing a device according to another aspect of the present invention includes steps of exposing an object to light using the above exposure apparatus, developing the exposed object, and processing the developed object to manufacture the device.

Other objects and further features of the present invention will become readily apparent from the following description of the embodiments with reference to accompanying drawings.

BRIEF DESCRIPTION OF THE DRAWINGS

FIGS. 9A and 9B are schematic plane views of an alignment mark shown in FIG. 7.

FIGS. 10A and 10B are schematic plane views of another alignment mark shown in FIG. 7.

DETAILED DESCRIPTION OF THE PREFERRED EMBODIMENTS

Figure 1:
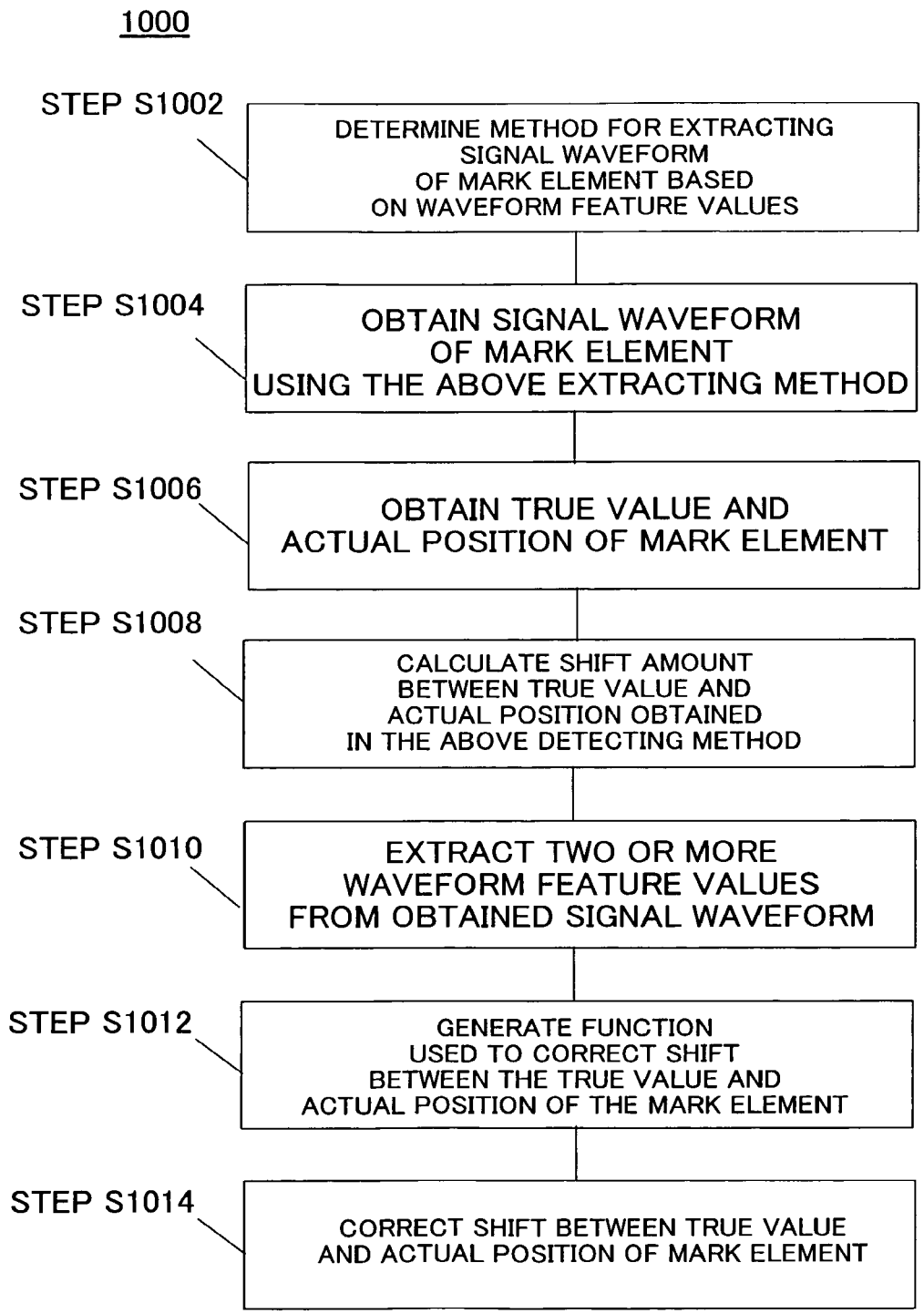
FIG. 1 is a flowchart for explaining an inventive position detecting method.

A description will now be given of a position detecting method according to one aspect of the present invention, with reference to the accompanying drawings. The same element in each figure is designated by the same reference numeral, thus a description thereof will be omitted.

Figure 7:
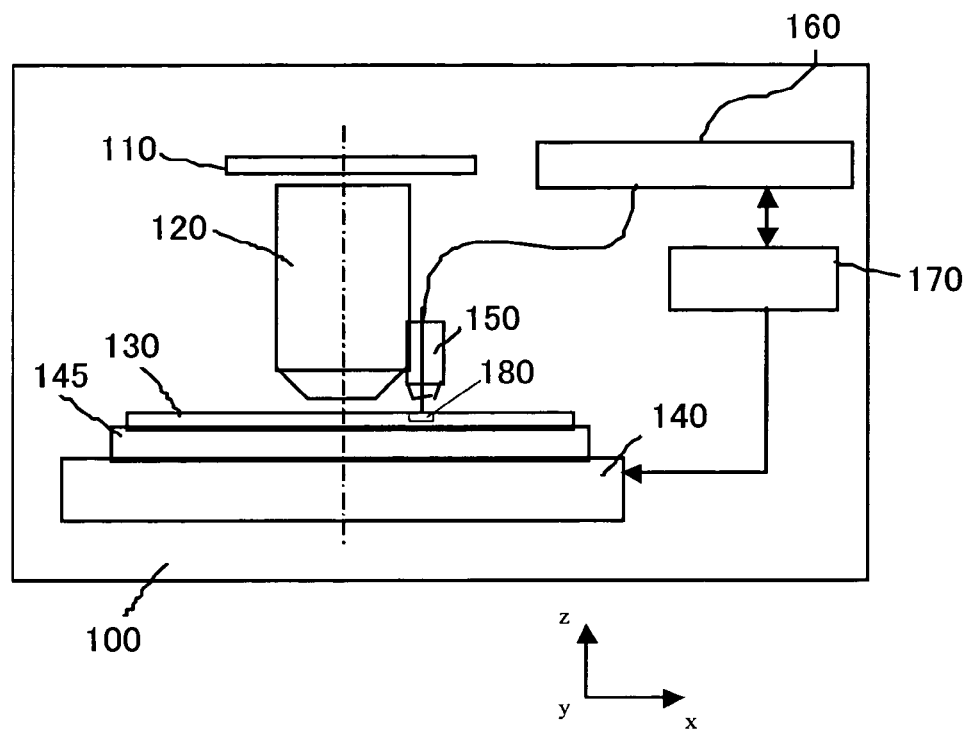
FIG. 7 is a schematic block diagram of an exposure apparatus according to one embodiment of the present invention.

FIG. 7 is a block diagram of an exposure apparatus 100. The exposure apparatus 100 is a projection exposure apparatus that exposes onto a wafer a circuit pattern of a reticle, e.g., in a step-and-repeat or a step-and-scan manner. Such an exposure apparatus is suitable for a submicron or quarter-micron lithography process, and this embodiment exemplarily describes a step-and-scan exposure apparatus (which is also called "a scanner"). The "step-and-scan manner", as used herein, is an exposure method that exposes a mask pattern onto a wafer by continuously scanning the wafer relative to the mask, and by moving, after a shot of exposure, the wafer stepwise to the next exposure area to be shot. The "step-and-repeat manner" is another mode of an exposure method that moves a wafer stepwise to an exposure area for the next shot every shot of cell projection onto a wafer.

Referring to FIG. 7, the exposure apparatus 100 includes a projection optical system 120, a wafer chuck 145, a wafer stage 140, an alignment optical system (or alignment scope) 150, an alignment signal processor 160, and a controller 170. The projection optical system 120 projects a reduced size of a reticle 110 that has a desired pattern, such as a circuit pattern. The wafer chuck 145 holds a wafer 130, onto which a primary coat pattern and alignment marks 180 have been formed in a pretreatment step. The wafer stage 140 positions the wafer 130 in place. The alignment optical system 150 measures a position of the alignment mark 180 on the wafer 130. FIG. 7 omits a light source, and an illumination optical system that illuminates the reticle 110 using light from the light source.

The controller 170 includes a CPU and a memory (not shown), and controls actions of the exposure apparatus 100. The controller 170 is electrically connected to an illumination apparatus (not shown), a reticle stage (not shown), the wafer stage 140, and the alignment signal processor 160. The controller 170 positions the wafer 130 through the wafer stage 140 based on positional information of the alignment mark from the alignment signal processor 160. A position detecting method 1000 of this embodiment to be executed by the controller 170 will be described later.

Figure 8:
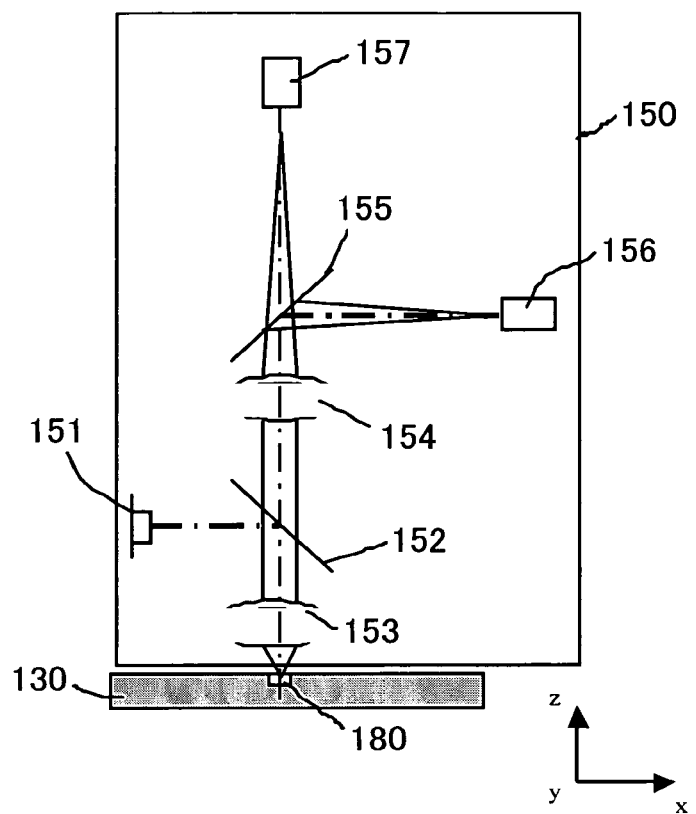
FIG. 8 is a schematic optical-path view showing principal components in an alignment optical system shown in FIG. 7.

A description will now be given of a detection principle of an alignment mark 180. FIG. 8 shows the schematic optical path of the main elements in the alignment optical system 150. Referring to FIG. 8, the illumination light from an alignment light source 151 passes through a lens 153 after being reflected on a beam splitter 152, and illuminates an alignment mark 180 on the wafer 130. The (reflected or diffracted) light from the alignment mark 180 passes through the lens 153, the beam splitter 152, and a lens 154, and is split by a beam splitter 155, and received by CCD sensors 156 and 157.

The alignment mark 180 is magnified by an imaging magnification of about 100 times by lenses 153 and 154, and imaged on the CCD sensors 156 and 157. The CCD sensors 156 and 157 are used to measure the offsets of the alignment mark 180 in the X and Y directions, respectively, and are arranged at a rotational angle of 90° relative to the optical axis. The CCD sensor may use a line sensor, which preferably uses, in this case, a cylindrical lens having power in a direction perpendicular to the measurement direction to condense the light in the direction perpendicular to the measurement direction, to execute an optical integration, and to average the information in the perpendicular direction. A description will be given of a positional measurement in the x direction, because the measurement principle is the same between the x and y directions.

The alignment marks 180 are arranged on a scribe line for each shot and may use, for example, alignment marks 180A and 180B shown in FIGS. 9A, 9B, 10A and 10B. The alignment mark 180 generalizes alignment marks 180A and 180B. Here, FIGS. 19A and 19B are plane sectional views of the alignment mark 180A. FIGS. 10A and 10B are plane sectional views of the alignment mark 180B. In FIGS. 9A, 9B, 10A and 10B, each of the alignment marks 180A and 180B include four mark elements 182A and 182B arranged at regular intervals. FIGS. 9A, 9B, 10A and 10B omit the resist, which is actually applied to the alignment marks 180A and 180B.

The alignment mark 180A arranges, as shown in FIG. 9A, four rectangular mark elements 182A at a pitch of 20 μm in the x direction, each of which has a size of 4 μm in a measurement x direction and 20 μm in a non-measurement y direction. The mark element 182A has a concave sectional shape as shown in FIG. 9B. The alignment mark 180B arranges four mark elements 182B, each of which replaces, as shown in FIGS. 10A and 10B, a contour of the mark element 182A in FIGS. 9A and 9B with a line width (critical dimension) of 0.6 μm.

Figure 11:
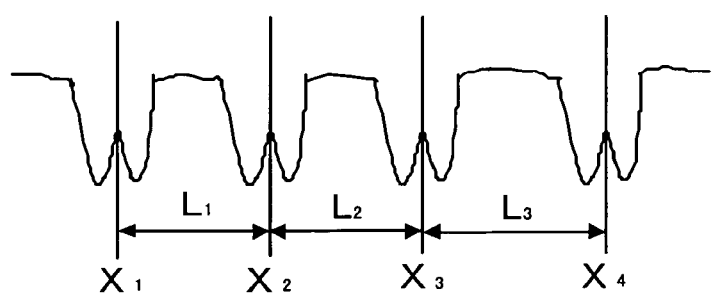
FIG. 11 is a graph of typical detection results when the alignment marks shown in FIGS. 9A, 9B, 10A and 10B are optically detected.

Whichever is used, the alignment mark 180A or 180B in FIGS. 9A and 9B or 10A and 10B, the CCD sensor 156 generally takes an image as shown in FIG. 11, due to a generation and interference of scattered rays at a lens' edge outside a NA of the lenses 153 and 154 in the alignment optical system 150. The alignment mark 180A has a dark contour, while the alignment mark 180B has a dark or bright concave part, as characterized and often observed by a bright field. Here, FIG. 11 is a graph showing a typical detection result when the alignment marks 180A and 180B shown in FIGS. 9A, 9B, 10A and 10B are optically detected.

Figure 12:
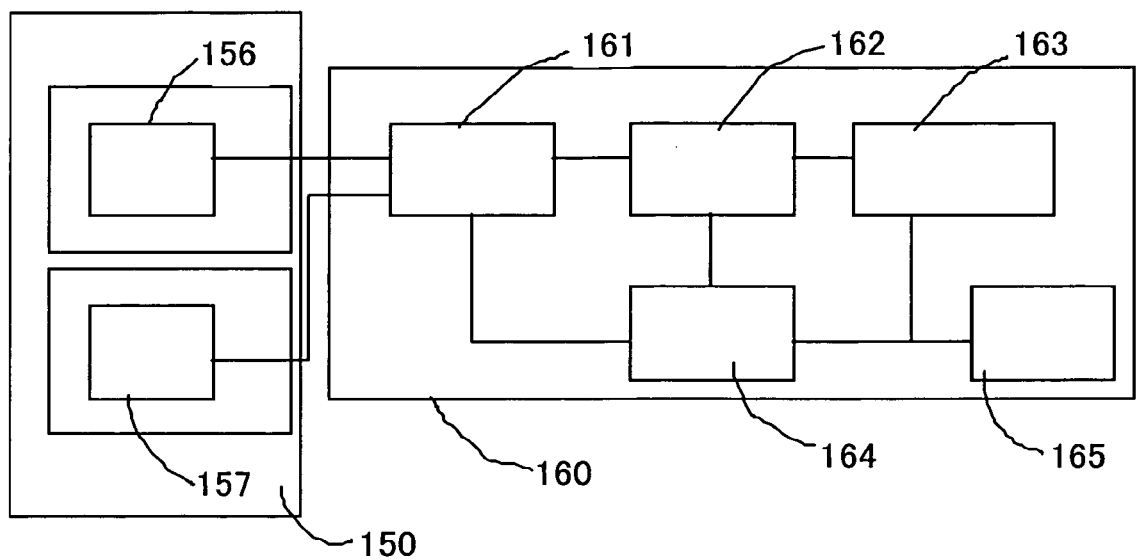
FIG. 12 is a schematic block diagram showing main functional modules in an alignment signal processor shown in FIG. 7.

The alignment signal processor 160 provides an alignment signal processing to an image of the alignment mark 180, which has been thus taken, as follows: FIG. 12 is a schematic block diagram showing main functional modules in the alignment signal processor 160.

Referring to FIG. 12, an A/D converter 161 digitalizes the alignment signals from the CCD sensors 156 and 157. Various signal processors in a storage unit 162 remove noise from the digitized alignment signal, and store the resultant signal in memory. A mark center detector 163 performs a digital signal processing for a stored digitized alignment signal. The mark center detector 163 executes a position detecting method 1000, which will be described later, by an operational element for the digitalized alignment signal, and detects a center position of the alignment signal. The CPU 164 is connected to an A/D converter 161, the storage unit 162, the mark center detector 163, and outputs control signals to them so as to control their actions. A communication part 165 communicates with the controller 170 shown in FIG. 7 for communications of necessary data, control commands, etc.

Various methods have been proposed to the digital signal processing by the mark center detector 163, which includes a method for detecting edge parts of the alignment signal and for calculating the distance between the edges, and a template or pattern matching that uses a normalized function. The present invention proposes a position detecting method 1000 for detecting a center position in the alignment signal as one example of a digital signal processing. The signal source may be a two-dimensional or one-dimensional signal. A two-dimensional image is voting-processed after its horizontal pixels are arranged in a perpendicular direction to create a histogram, averaged with respect to the main components, and converted into a one-dimensional image. The proposed, inventive digital signal processing independently performs X and Y measurements, and the base signal processing for positioning is a one-dimensional signal processing. For example, the digital signals representative of the two-dimensional images on the CCD sensors 156 and 157 are integrated and averaged, and converted into a one-dimensional line signal.

Referring now to FIG. 1, a description will be given of a position detecting method 1000 of a first embodiment. Here, FIG. 1 is a flowchart of the position detecting method 1000.

Initially, an extraction method is set for a signal waveform of the mark element 182A or 182B based on a waveform feature value to be obtained (step S1002). The "waveform feature value," as used herein, means a parameter that characterizes a signal waveform of the mark element 182A or 182B. Step S1002 may apply various methods to the alignment signal waveform extracting method. However, this embodiment uses a method for extracting a signal waveform from the reflectance at the mark element 182A or 182B (or for obtaining a center position of the mark element based on the symmetry of the signal waveform), and a method for first-order-differentiating a signal waveform and for extracting the signal waveform (or for obtaining the center position of the mark element from the first order differentiated value of the signal waveform).

Next, the signal waveform of the mark element 182A or 182B is obtained with the above extracting method (step S1004). This step obtains the waveform from the mark element 182A or 182B, and the controller 160 calculates the signal waveform of the mark element 182A or 182B.

Next, a true position or value of the mark element 182A or 182B and an actual position of the mark element 182A or 182B are obtained (step S1006). The "true position," as used herein, is a value of an ideal position of the mark element 182A or 182B, and calculated, for example, by simulation. Since a shift amount between the actual position and the true position serves as learning data for a predicting model, which will be described later, this embodiment refers to the alignment signal data having a known true position as teacher data.

Figure 2A:
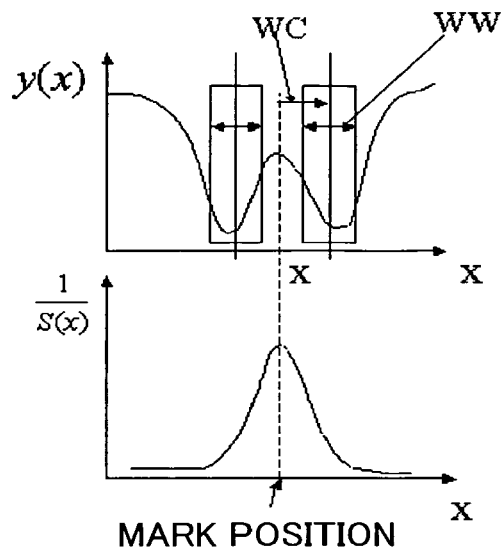
FIGS. 2A and 2B are waveforms for explaining a detection method of an alignment signal waveform in the position detecting method shown in FIG. 1.
Figure 2B:
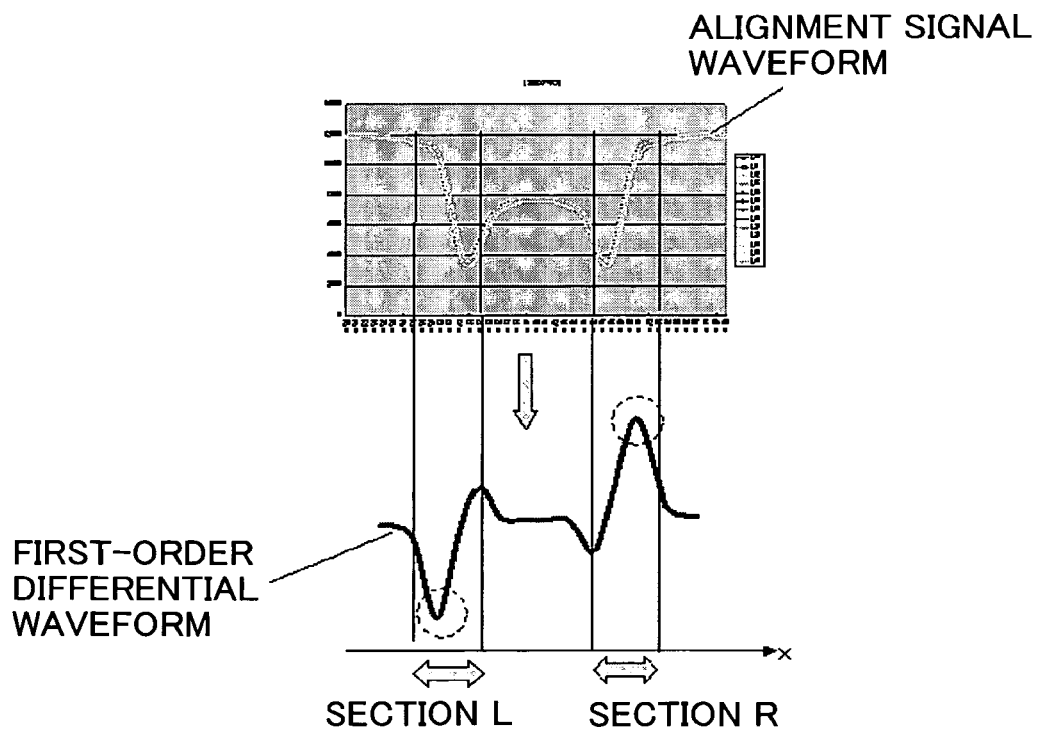

Referring now to FIGS. 2A and 2B, a description will be given of a method for detecting a position of a mark element using various signal processes. Here, FIGS. 2A and 2B are waveforms for explaining a detection method of an alignment signal waveform.

Initially, for example, as shown in FIG. 2A, S(x) in a measuring direction x relative to an alignment signal row y is defined as Equation 1: Equation 1 corresponds to Equation 24 in Japanese Patent Application, Publication No. 8-94315 in which a is set to WC−WW/2 and b is set to WC+WW/2.

$$S(x) = \sum_{i=WC-\frac{WW}{2}}^{WC+\frac{WW}{2}} |y(x-i) - y(x+i)|$$ [EQUATION 1]

As shown in FIG. 2A, S(x) at a certain point x is calculated from Equation 1, and S(x) is obtained by varying x. The minimum of S(x) or the maximum of 1/S(x) shown in FIG. 2A is set to a mark position. The minimum value of S(x) is calculated with precision of sub-pixel by approximating a discrete signal S(x) with a function. This specification refers to this detection processing method as P1.

Another mark element position detecting method sets sections L and R for an alignment signal y as shown in FIG. 2B. After the signal is filtered to remove random noises in each section, the mark position is calculated by using a midpoint between an x coordinate indicative of a minimum value in the section L and an x coordinate indicative of a maximum value in the section R for the first-order-differentiated signal. Since the first-order-differentiated signal is a discrete signal, the minimum and maximum values are calculated with precision of sub-pixel, for example, by approximating the first-order-differentiated signal with a function. This specification refers to this detection processing method as P2.

A shift amount is calculated between the true value and the actual position obtained in the above detecting method (step S1008). In Step S1008, the true value is known when the alignment waveform is a simulated waveform, and the shift amount is obtained as an offset between the true value and the actual position (or signal processing result), which will be described later, when the wafer process error occurs. The wafer process error can be calculated by the simulation, and occurs, for example, in accordance with a step amount of the alignment mark, a resist's thickness, and coverage on the wafer.

The shift amount can be calculated without a true value calculated by the simulation. For example, a position of the alignment mark is detected based on the alignment waveform, the wafer is positioned based on the detection result, and the exposure follows. Thereafter, the wafer is inspected by using an overlay inspector. The shift amount between actual position and the true value is calculated from the inspection result. In this case, the actual position corresponds to a position of the alignment mark obtained from the alignment waveform, and the true value corresponds to a position at which the shift amount detected by the overlay inspector is zero.

Next, two or more waveform feature values are extracted from the obtained signal waveform (step S1010).

A description will be given of an extraction of the waveform feature value. This embodiment refers to not only a waveform evaluation value that specifies a waveform shape but also an arbitrary signal processing result as a waveform feature value. In this embodiment, the waveform feature value includes 1) a difference between the signal waveform of the mark element 182A or 182B and another signal waveform different from that of the signal waveform of the mark element 182A or 182B, 2) a waveform evaluation value as a gradient difference of a signal waveform of the mark element 182A or 182B, 3) a waveform evaluation value as a contrast of the signal waveform of the mark element 182A or 182B, and 4) a waveform evaluation value as a difference between left and right heights in the signal waveform of the mark element 182A or 182B. The results of the detection processes P1 and P2 are originally given in the coordinate, and the coordinate values do not provide a feature amount. Therefore, this embodiment defines a waveform feature value, for example, as a difference P2-P1 between the signal processing P2 and the signal processing P1.

Figure 3:
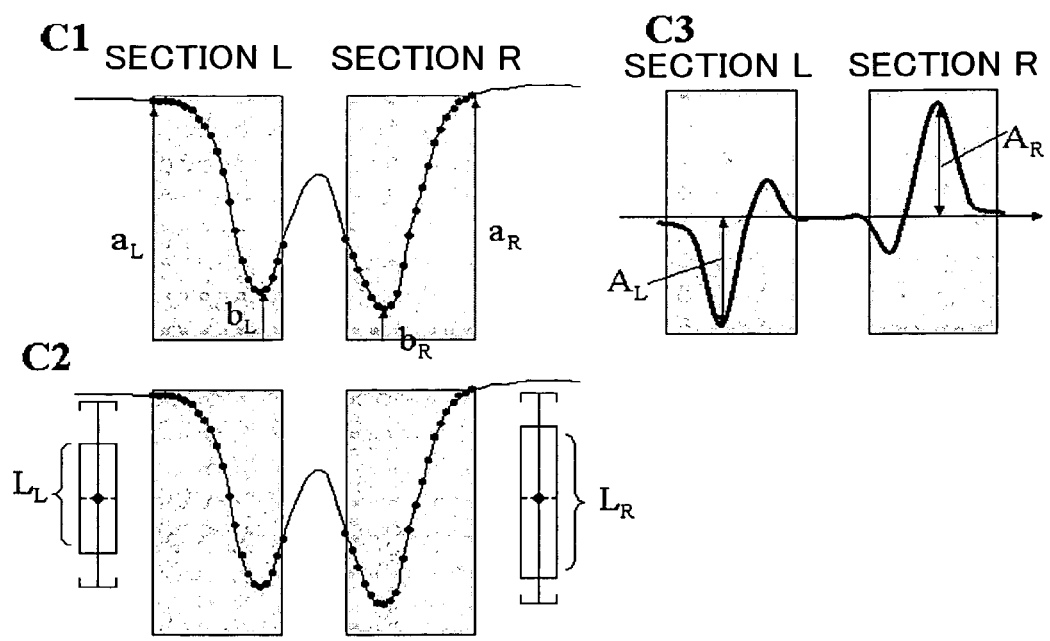
FIG. 3 is a waveform for explaining a calculation method of a waveform evaluation value from an alignment signal waveform in the position detecting method shown in FIG. 1.

Referring now to FIG. 3, a description will be given of the waveform evaluation value. Here, FIG. 3 is a waveform for explaining a method for calculating the waveform evaluation value from the alignment signal.

FIG. 3 sets the left and right sections of the waveform for the waveform from which one element is extracted out of the alignment signal, and quantifies a waveform shape in each section.

A first waveform evaluation value C1 is defined as Equation 2, where $a_L$ and $b_L$ are maximum and minimum values of the signal row y in the section L, $a_R$ and $b_R$ are maximum and minimum values of the signal row y in the section R.

$$C1 = \frac{(b_L/a_L + b_R/a_R)}{2} \quad \text{[EQUATION 2]}$$

A waveform evaluation value C2 is defined as Equation 3 where $L_L$ is a length of a box when the signal row y in the section L is expressed by a boxplot used for the statistic approach, $L_R$ is a length of a box when the signal row y in the section R is expressed by a boxplot used for the statistic approach. See R. Becker, J. Chambers, and A. Wilks, "S Language I", Kyoritsu Publishing, for the boxplot.

$$C2 = \frac{L_L - L_R}{L_L + L_R} \quad \text{[EQUATION 3]}$$

The waveform evaluation value C3 is defined as Equation 4, where $A_L$ is an absolute value of the minimum value of the first order differentials in the section L shown in FIG. 2B, $A_R$ is an absolute value of the maximum value of the first order differentials in the section R.

$$C3 = A_L - A_R \quad \text{[EQUATION 4]}$$

Since the waveform evaluation value is obtained for each alignment mark element, an average of four waveform evaluation values is used to obtain a waveform value for each alignment mark when four mark elements exist as in this embodiment.

Next, a function is generated to correct a shift between the true value and the actual position of the mark element 182A or 182B (step S1012). Characteristically, step S1012 generates a function using a waveform feature value. Thereby, an offset amount can be precisely predicted even when there is an error due to an interaction of WIS caused by plural causes, and a WIS-TIS interaction. As a result, the position detecting method 1000 can precisely detect a position. The above function is available for each semiconductor process.

First Embodiment

A description will now be given of a method for predicting a shift amount between the true value and the detection processing result that uses a N-th order polynomial that includes a term of an interaction, plural waveform evaluation values, and a multivariate analysis that uses a result of the detection processes P1 and P2.

Figure 4:
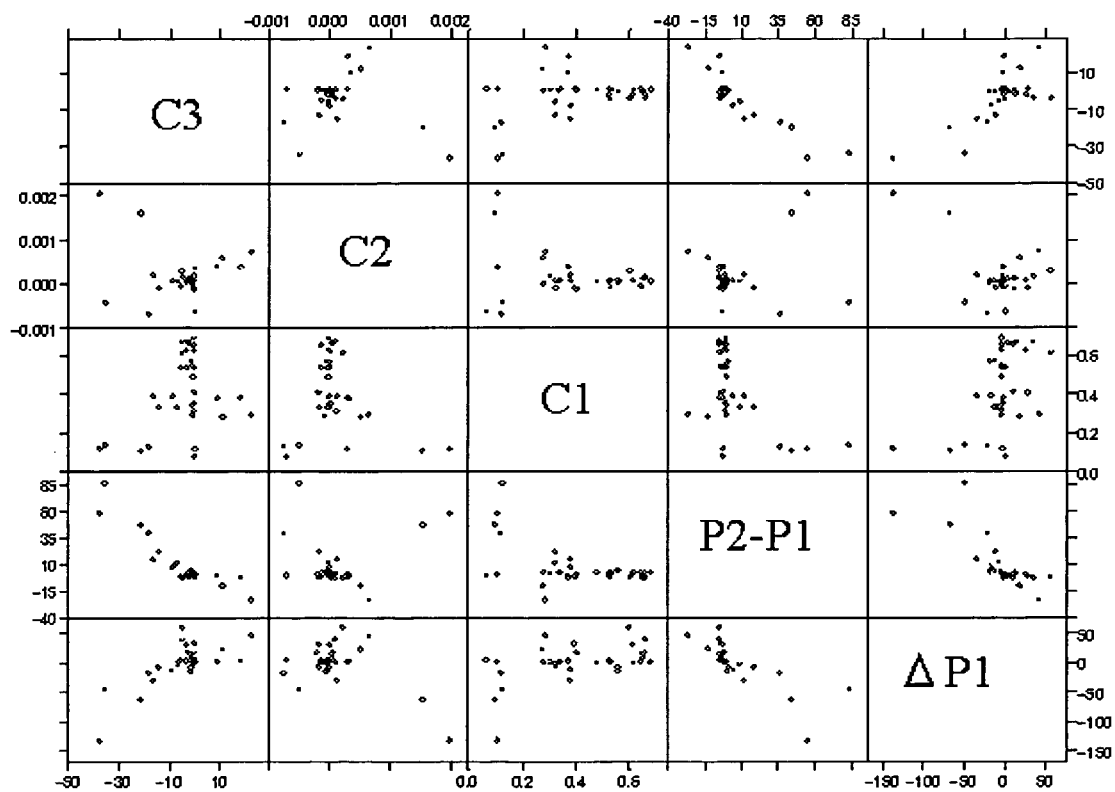
FIG. 4 is a schematic scatter diagram among a shift ΔP1 between a true value and a signal process P1, waveform evaluation values C1, C2, and C3, and a difference P2–P1 between signal processes P1 and P2.
Figure 5:
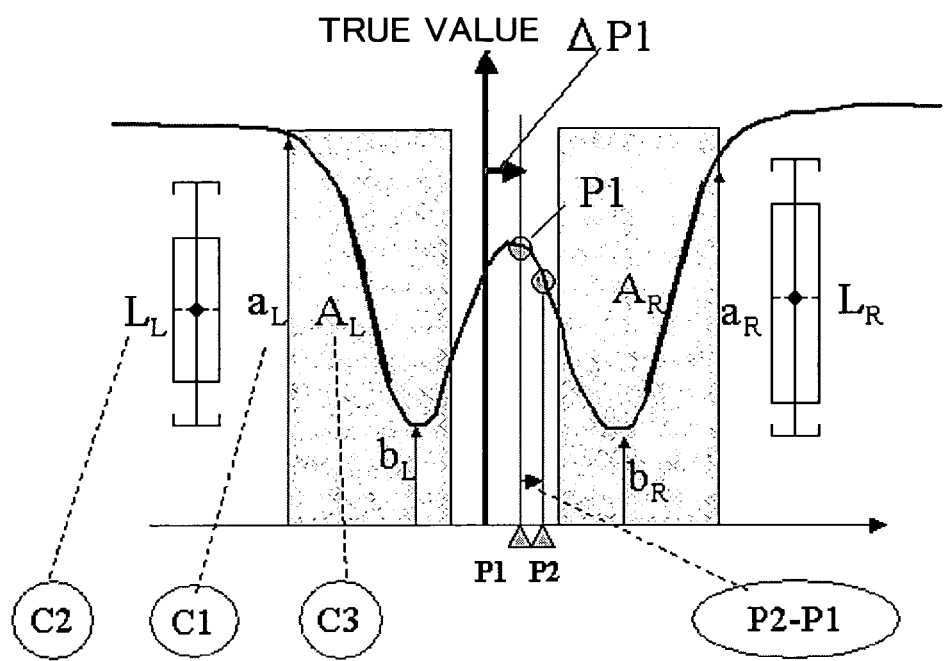
FIG. 5 is a view showing a relationship among the waveform evaluation values C1, C2 and C3 and signal processes P1 and P2 in relation to one signal waveform.

FIG. 4 is a scatter diagram that is formed by an optical simulation among a shift ΔP1 between the true value and the signal process P1 when a wafer process error is generated, and a difference P2–P1 between the signal processes P1 and P2 and waveform evaluation values C1, C2 and C3.

A target variable is set to ΔP1 between the true value and the signal process P1, and is predicted by using an equation model defined as Equation 5, P2–P1, C1, C2 and C3 as predictor variables, and multivariate analysis:

$$\Delta P1 = \sum_{i=1}^{N} a_{1i}(P2-P1)^i + \sum_{i=1}^{N} a_{2i}C1^i + \sum_{i=1}^{N} a_{3i}C2^i + \quad \text{[EQUATION 5]}$$
$$\sum_{i=1}^{N} a_{4i}C3^i + b_1 \cdot (P2-P1) \cdot C1 + b_2 \cdot (P2-P1) \cdot C2 +$$
$$b_3 \cdot (P2-P1) \cdot C3 + b_4 \cdot C1 \cdot C2 + b_5 \cdot C1 +$$
$$C3 + b_6 \cdot C2 \cdot C3 + c_1 \cdot (P2-P1) \cdot C1 \cdot C2 +$$
$$c_2 \cdot (P2-P1) \cdot C1 \cdot C3 + c_3 \cdot (P2-P1) \cdot C2 \cdot C3 +$$
$$c_4 \cdot C1 \cdot C2 \cdot C3 + d_1 \cdot (P2-P1) \cdot C1 \cdot C2 \cdot C3$$

The second and subsequent terms in Equation 5 are terms indicative of an interaction. Here, the "interaction" is a term expressed by a product of predictor variables, such as a product C1×C2. In other words, it corresponds to an error of WIS caused by an interaction of plural causes. This embodiment optimizes a coefficient parameter by using Akaike Information Criterion ("AIC") as a regression predicting equation where N=3.

Next, a shift between the true value and the actual position of the mark element 182A or 182B is corrected based on the above function (step S1014). Accordingly, an offset amount can be predicted with precision even when there is an error due to an interaction of WIS of plural causes and a WIS-TIS interaction. As a result, the position detecting method 1000 can detect a position with precision.

Step S1014 uses the model predicted by this embodiment to obtain the waveform evaluation values C1, C2 and C3 and signal processing results P1 and P2 for the actual waveform. The shift amount ΔP1 is predicted from the obtained value, and corrected with respect to the first signal processing result P1.

Figure 6:
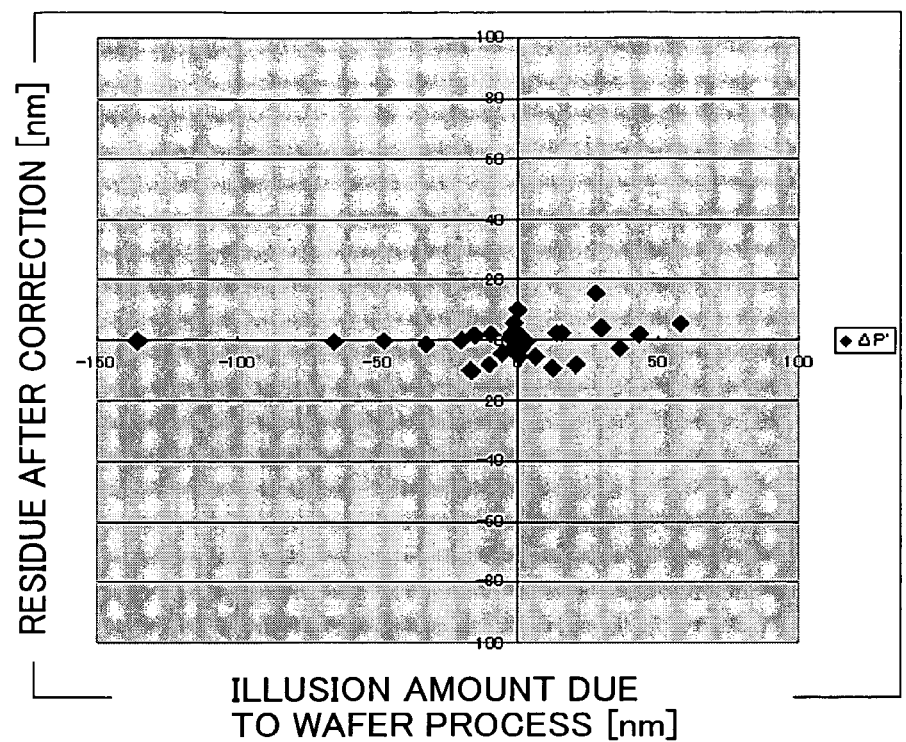
FIG. 6 is a graph showing a relationship between an illusion amount due to the wafer process and a residue after a correction.

FIG. 6 plots the predicted residue of the model in relation to the teacher data in this embodiment, in which R-squared, an index of application easiness of the model is 0.9756. The illusion amount (API) due to the wafer process error improves from 200 nm to 30 nm in the range, and provides a validity of this embodiment. Here, FIG. 6 is a graph showing a relationship between the illusion amount due to the wafer process and the residue after correction.

While this embodiment uses AIC as an evaluation approach that adds a penalty term to a square sum of the predicted residue to prevent over-fitting of the regression model, the inventive approach to improve the model generalization performance is not limited to this embodiment and may use a cross validation, a bootstrap method, etc. to determine the N-th order. After the N-th order is determined, each coefficient parameter can be determined through a neural network.

Second Embodiment

While the first embodiment includes a term of an interaction in the predicting model equation, the present invention is not limited to this embodiment and may predict by using a N-th order polynomial that does not include an interaction. Equation 6 below is a model equation in the second embodiment:

$$\Delta P1 = \sum_{i=1}^{N} a_{1i}(P2-P1)^i + \sum_{i=1}^{N} a_{2i}C1^i + \sum_{i=1}^{N} a_{3i}C2^i + \sum_{i=1}^{N} a_{4i}C3^i \quad \text{[EQUATION 6]}$$

Third Embodiment

The present invention is applicable when the waveform feature value includes only a waveform evaluation value. The third embodiment uses a model equation defined as Equation 7, in which the waveform feature values are C1, C2 and C3:

$$\Delta P1 = \sum_{i=1}^{N} a_{1i}C1^i + \sum_{i=1}^{N} a_{2i}C2^i + \sum_{i=1}^{N} a_{3i}C3^i + b_1 \cdot C1 \cdot C2 + b_2 \cdot C1 \cdot C3 + b_3 \cdot C2 \cdot C3 + \ldots + c_1 \cdot C1 \cdot C2 \cdot C3 \quad \text{[EQUATION 7]}$$

Fourth Embodiment

The present invention is applicable when the waveform feature value is merely a signal processing result. The fourth embodiment uses a model equation defined as Equation 8, in which the signal processing results are P1, P2 and P3: It is enough that P3 originates from one of other various signal processing methods different from that for P1 and P2, such as a method for setting a slice level and detecting a mark position, and a method for detecting a mark position using template matching.

$$\Delta P1 = \sum_{i=1}^{N} a_{1i}(P2-P1)^i + \sum_{i=1}^{N} a_{2i}(P3-P1)^i + b_1 \cdot (P2-P1) \cdot (P3-P1) \quad \text{[EQUATION 8]}$$

In exposure, the light from the illumination apparatus illuminates the reticle 110, and the projection optical system 120 images a pattern of the reticle 110 onto the wafer 130. This embodiment provides an arc-shaped or ring-shaped image surface, and the overall pattern of the reticle 110 is transferred to the wafer 130 when the reticle 110 and the wafer 130 are scanned at a reduction speed ratio. The position detecting method 1000 of this embodiment detects a position of the wafer 130 with high precision. Even when the detection results of the alignment marks scatter, this method can maintain both the necessary alignment accuracy and throughput. As a result, the exposure apparatus 100 provides fine processing with an improved throughput and productivity.

Figure 13:
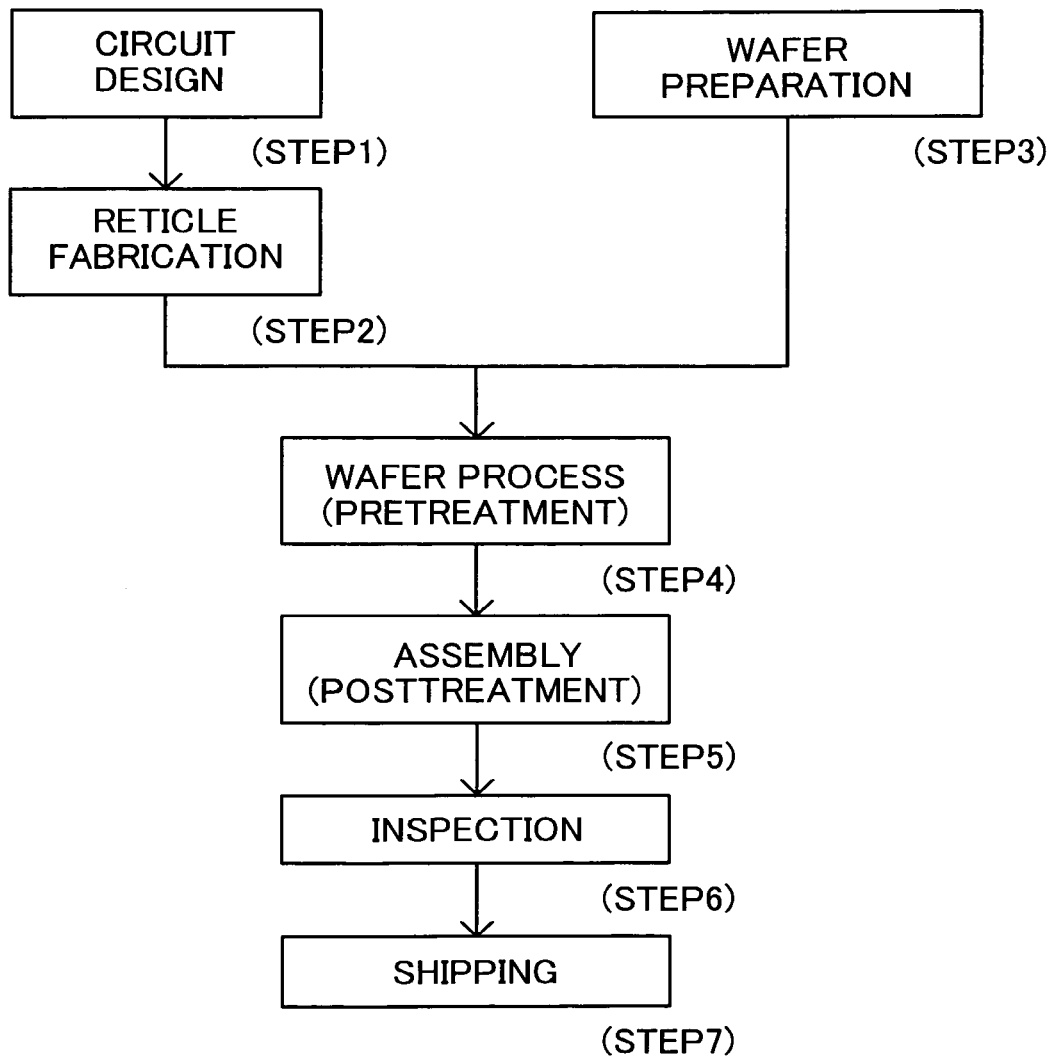
FIG. 13 is a flowchart for explaining a method for manufacturing devices (semiconductor chips such as ICs, LSIs, and the like, LCDs, CCDs, etc.) using the exposure apparatus shown in FIG. 1.
Figure 14:
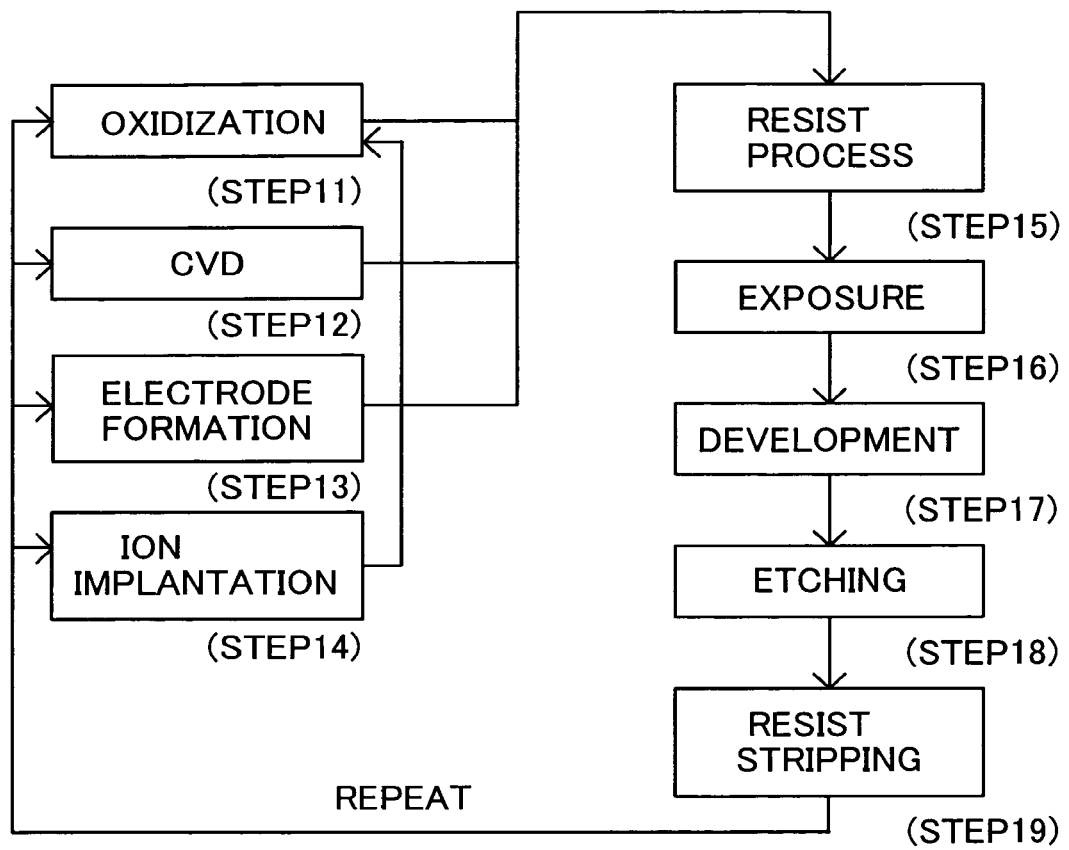
FIG. 14 is a detailed flowchart for Step 4 of wafer process shown in FIG. 13.

Referring now to FIGS. 13 and 14, a description will be given of an embodiment of a device manufacturing method using the above exposure apparatus 100. FIG. 13 is a flowchart for explaining the fabrication of devices (i.e., semiconductor chips such as IC and LSI, LCDs, CCDs, etc.). Here, as an example, a description will be given of a fabrication of a semiconductor chip. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests on the semiconductor device made in Step 5, such as a validity test and a durability test. Through these steps, a semiconductor device is finished and shipped (Step 7).

FIG. 14 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 200 to expose the circuit pattern on the mask onto the wafer. Step 17 (development) develops the exposed wafer. Step 18 (etching) etches parts other than the developed resist image. Step 19 (resist stripping) removes the disused resist after etching. These steps are repeated and multi-layer circuit patterns are formed on the wafer. The device fabrication method of this embodiment may manufacture higher quality devices than the conventional one.

Further, the present invention is not limited to these preferred embodiments, and various variations and modifications may be made without departing from the scope of the present invention.

This application claims a benefit of foreign priority based on Japanese Patent Application No. 2004-293026, filed on Oct. 5, 2004, which is hereby incorporated by reference herein in its entirety as if fully set forth herein.

What is claimed is:

1. A method of detecting a position of a mark element on an object on a basis of a signal waveform of the mark element, said method comprising steps of:

determining an extracting method of the signal waveform of the mark element;

obtaining the signal waveform of the mark element using the extracting method;

extracting at least two kinds of waveform feature values from the signal waveform which is obtained, the waveform feature values being parameters that characterize the signal waveform of the mark element;
generating a function which corrects a shift amount between a true value indicating an ideal position of the mark element and a real position of the mark element; and
correcting the shift amount on a basis of the function,
wherein the function, which includes a product of the at least two kinds of waveform feature values, is generated using the at least two kinds of waveform feature values.

2. A method according to claim 1, wherein one of the at least two kinds of waveform feature values is a difference between the signal waveform of the mark element and another signal waveform differing from the signal waveform of the mark element.

3. A method according to claim 1, wherein one of the at least two kinds of waveform feature values is a waveform evaluation value that is a gradient difference of the signal waveform of the mark element.

4. A method according to claim 1, wherein one of the at least two kinds of waveform feature values is a waveform evaluation value that is a contrast of the signal waveform of the mark element.

5. A method according to claim 1, wherein one of the at least two kinds of waveform feature values is a waveform evaluation value that is a difference between left and right heights in the signal waveform of the mark element.

6. A method according to claim 1, wherein the function is obtained for every semiconductor process.

7. A position detector for detecting a position of a mark element on a basis of a signal waveform of the mark element, said apparatus comprising:
a controller configured to determine an extracting method of the signal waveform of the mark element, to obtain the signal waveform of the mark element using the extracting method, to extract at least two kinds of waveform feature values from the signal waveform which is obtained, the waveform feature values being parameters that characterize the signal waveform of the mark element, to generate a function which corrects a shift amount between a true value indicating an ideal position of the mark element and a real position of the mark element, and to correct the shift amount on a basis of the function,
wherein the function, which includes a product of the at least two kinds of waveform feature values, is generated using the at least two kinds of waveform feature values.

8. An exposure apparatus comprising:
a projection optical system for exposing a pattern of a mask on an object using light from light source; and
a position detector for detecting a position of a mark element from a signal waveform of the mark element,
wherein the position detector includes a controller configured to determine an extracting method of the signal waveform of the mark element, to obtain the signal waveform of the mark element using the extracting method, to extract at least two kinds of waveform feature values from the signal waveform which is obtained, the waveform feature values being parameters that characterize the signal waveform of the mark element, to generate a function which corrects a shift amount between a true value indicating an ideal position of the mark element and a real position of the mark element, and to correct the shift amount on a basis of the function, and
wherein the function, which includes a product of the at least two kinds of waveform feature values, is generated using the at least two kinds of waveform feature values.

9. A method of manufacturing a device, said method comprising steps of:
exposing an object using an exposure apparatus comprising a projection optical system for exposing a pattern of a mask on the object using light from a light source, and a position detector for detecting a position of a mark element from a signal waveform of the mark element; and
developing the exposed object,
wherein the position detector includes a controller configured to determine an extracting method of the signal waveform of the mark element, to obtain the signal waveform of the mark element using the extracting method, to extract at least two kinds of waveform feature values from the signal waveform which is obtained, the waveform feature values being parameters that characterize the signal waveform of the mark element, to generate a function which corrects a shift amount between a true value indicating an ideal position of the mark element and a real position of the mark element, and to correct the shift amount on a basis of the function, and
wherein the function, which includes a product of the at least two kinds of waveform feature values, is generated using the at least two kinds of waveform feature values.

10. A method of detecting a position of an alignment mark on an object including a plurality of mark elements on a basis of an alignment mark signal waveform, said method comprising steps of:
determining an extracting method of a signal waveform of the mark element on a basis of a waveform feature value as a parameter that characterizes the signal waveform of the mark element;
obtaining the signal waveform of the mark element using the extracting method;
extracting at least two kinds of waveform feature values from the signal waveform which is obtained;
generating a function which corrects a shift amount between a true value indicating an ideal position of the mark element and a real position of the mark element; and
correcting the shift amount on a basis of the function,
wherein the function, which includes a product of the at least two kinds of waveform feature values, is generated using the at least two kinds of waveform feature values.

11. A method of detecting a position of an alignment mark on an object including a mark element, said method comprising steps of:
obtaining a signal waveform of the mark element;
extracting, by different extracting methods, at least two kinds of waveform feature values from the signal waveform which is obtained, the waveform feature values being parameters that characterize the signal waveform of the mark element; and
correcting a shift amount between a true value indicating an ideal position of the mark element and a real position of the mark element on a basis of a function which relates the at least two kinds of waveform feature values to the shift amount and of the at least two kinds of waveform feature values extracted from the signal waveform which is obtained,
wherein the function is a high-order function including a term of an interaction of the at least two kinds of waveform feature values.

12. A method according to claim 11, wherein one of the at least two kinds of waveform feature values is a difference between the position of the alignment mark that is obtained by a signal processing on a basis of one signal waveform of the mark element and the position of the alignment mark which is obtained by another signal processing on a basis of the one signal waveform.

13. A method according to claim 11, wherein the function is a second or higher-order function including at least two kinds of waveform feature values as variables.

* * * * *